(12) United States Patent
Li

(10) Patent No.: US 12,386,269 B2
(45) Date of Patent: Aug. 12, 2025

(54) CRITICAL DIMENSION MEASUREMENT MARK STRUCTURE

(71) Applicant: CHANGXIN MEMORY TECHNOLOGIES, INC., Hefei (CN)

(72) Inventor: Wei Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 813 days.

(21) Appl. No.: 17/656,055

(22) Filed: Mar. 23, 2022

(65) Prior Publication Data

US 2022/0317561 A1 Oct. 6, 2022

(30) Foreign Application Priority Data

Apr. 6, 2021 (CN) .......................... 202110366646.1

(51) Int. Cl.
*G03F 7/00* (2006.01)
*H01L 23/544* (2006.01)

(52) U.S. Cl.
CPC ...... *G03F 7/70616* (2013.01); *G03F 7/70625* (2013.01); *G03F 7/70633* (2013.01); *G03F 7/70683* (2013.01); *H01L 23/544* (2013.01)

(58) Field of Classification Search
CPC ............. G03F 7/70625; G03F 7/70633; G03F 7/70616; G03F 7/70683; H01L 22/20; H01L 22/26; H01L 23/544
See application file for complete search history.

(56) References Cited

U.S. PATENT DOCUMENTS

| | | | | |
|---|---|---|---|---|
| 5,701,013 A | * | 12/1997 | Hsia | ........................ H01L 22/34 257/797 |
| 8,823,936 B2 | * | 9/2014 | Dai | ..................... G03F 7/70633 356/636 |
| 10,177,094 B1 | * | 1/2019 | Hsu | ........................ H01L 23/544 |
| 2015/0248068 A1 | * | 9/2015 | Wang | ................... G03F 7/70641 355/56 |
| 2016/0196381 A1 | * | 7/2016 | Ning | ........................ G03F 1/36 716/55 |
| 2017/0026561 A1 | * | 1/2017 | Xu | .......................... H04N 23/71 |
| 2020/0142324 A1 | * | 5/2020 | Staals | ................. G03F 7/70625 |

* cited by examiner

*Primary Examiner* — Stewart A Fraser
(74) *Attorney, Agent, or Firm* — Syncoda LLC; Feng Ma

(57) ABSTRACT

A critical dimension measurement mark structure includes a target area and a first pattern area located in the target area. The first pattern area and the target area are located on different horizontal planes. The first pattern area includes a first measurement part and a second measurement part which have different line widths, and the first measurement part and the second measurement part form an asymmetric open continuous pattern.

15 Claims, 2 Drawing Sheets

CRITICAL DIMENSION MEASUREMENT MARK STRUCTURE

CROSS-REFERENCE TO RELATED APPLICATION

The present application claims priority to Chinese Patent Application No. 202110366646.1 filed on Apr. 6, 2021, the disclosure of which is hereby incorporated by reference in its entirety.

BACKGROUND

Currently, in a semiconductor manufacturing process, a line width scanning electronic microscope, also referred to as a Critical Dimension Scanning Electronic Microscope (CD-SEM or CDSEM) is used to measure CD of a pattern formed on a wafer. With the development of semiconductor manufacturing technology, the CD of a semiconductor device is becoming smaller and smaller. In order to ensure the accuracy of the pattern on the wafer after photolithography, after the pattern on a photomask is transferred onto the wafer through exposure and development, the wafer with the pattern may be placed on a CDSEM carrier to determine whether the dimension of the pattern meets the design requirements of a large-scale integrated circuit or not, so as to know the accuracy of photolithography.

SUMMARY

The disclosure relates to semiconductor manufacturing equipment and in particular to a Critical Dimension (CD) measurement mark structure.

An objective of this disclosure is to provide a Critical Dimension (CD) measurement mark structure, which is used for solving the problem in the relevant art that a photoresist in the CD measurement parts easily spills out in a closed pattern area.

In order to achieve the above and other related purposes, the disclosure provides a critical dimension measurement mark structure, which includes a target area and a first pattern area located in the target area. The first pattern area and the target area are located on different horizontal planes, the first pattern area includes a first measurement part and a second measurement part which have different line widths, and the first measurement part and the second measurement part form an asymmetric open continuous pattern.

BRIEF DESCRIPTION OF THE DRAWINGS

The specific features of the invention to which this disclosure relates are set forth in the appended claims. The features and advantages of the invention to which this disclosure relates can be better understood with reference to the exemplary implementation modes described in detail hereinafter and the accompanying drawings. The brief description of the drawings is as follows.

DETAILED DESCRIPTION

Figure 1:
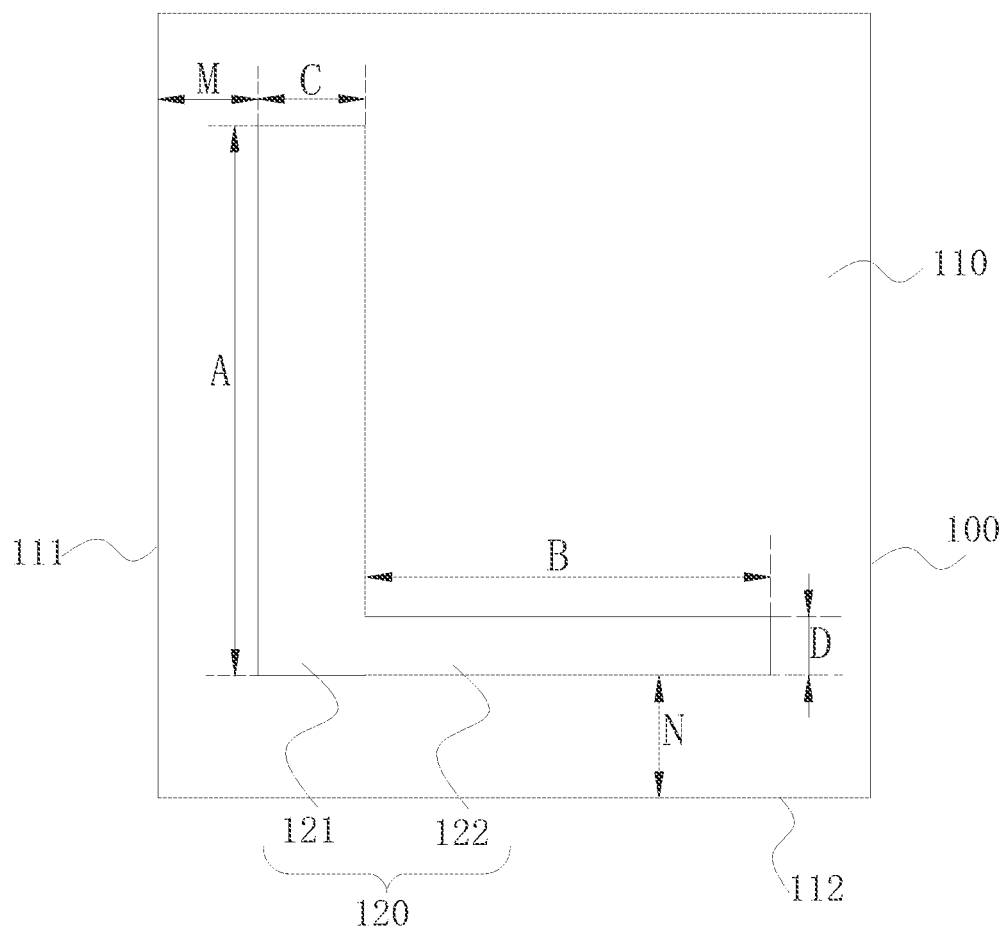
FIG. 1 illustrates a schematic diagram of a Critical Dimension (CD) measurement mark structure of the disclosure.

The implementation modes of the disclosure will be described below with reference to specific embodiments as exemplified, and other advantages and effects of the disclosure will be readily apparent to those skilled in the art from the content disclosed in this specification.

The exemplary implementation modes will now be described more fully with reference to the accompanying drawings. The exemplary implementation modes, however, can be is implemented in many forms and should not be construed as being limited to the implementation modes set forth herein; rather, these implementation modes are provided so that the disclosure will be thorough and complete, and the concept of the exemplary implementation modes will be fully conveyed to those skilled in the art. The same reference numerals in the figures denote the same or similar structures, and thus their detailed description will be omitted. The figures are shown to illustrate structures and are not limited to their dimensions.

Although relative terms such as "upper" and "lower" are used in this specification to describe a relative relationship of one illustrated component to another, these terms are used in this specification for convenience only, such as in accordance with the orientation of the examples depicted in the drawings. It will be understood that if the illustrated device is turned upside down, the "upper" component will become the "lower" component. When a structure is "on" another structure, it may mean that the structure is integrally formed on the other structure, or that the structure is "directly" disposed on the other structure, or that the structure is "indirectly" disposed on the other structure through another structure.

The terms "a", "an", "the" and "said" are used to mean that there are one or more elements/components/the like; and the terms "comprising" and "having" are used in an open-ended inclusive sense and mean that there may be additional elements/components/the like in addition to the listed elements/components/the like. The terms "first" and "second" are used as labels only, and are not a limitation on the quantity of their objects.

Due to the fact that the wafer with the pattern has rough pattern and edge, the measurement for the CD of a layer (layer CD) with large line width and the CD of an implant layer (implant layer CD) is difficult, and measurement inaccuracy is easily caused by interference of large noise. In view of the defect that the measurement for the large-line-width layer CD and the implant layer CD is difficult, CD measurement parts on the wafer are generally measured by the CDSEM to monitor the CD condition of the layers. At present, closed patterns such as a P-type pattern and an R-type pattern are mostly adopted by the CD measuring parts, which will easily cause a closed photoresist to spill out in the subsequent processing procedure to cause defects; or the dimension design is improper, so that the patterns cannot be resolved.

For the above problems, the disclosure provides a CD measurement mark structure, which is used for solving the problem in some implementations that a photoresist in CD measurement parts easily spills out in a closed pattern area, to reduce the defect risk caused by spill out of the photoresist, and improve the yield.

FIG. 1 illustrates a schematic diagram of a CD measurement mark structure of the disclosure. The CD measurement mark structure 100 includes a target area 110 and a first pattern area 120 located in the target area 110. The first pattern area 120 and the target area 110 are located on different horizontal planes, the first pattern area 120 includes a first measurement part 121 and a second measurement part 122 which have different line widths, and the first measurement part 121 and the second measurement part 122 form an asymmetric open continuous pattern.

The first pattern area 120 may be set to be convex or concave relative to the target area 110 (the target area 110 is on a wafer, and located on the same horizontal plane with the surface of the wafer), so that the first pattern area 120 and the target area 110 are located on different horizontal planes. The first measurement part 121 and the second measurement part 122 in the first pattern area 120 form the asymmetric open continuous pattern, such that a closed area cannot be generated, which is different from closed patterns used in the relevant art, thus the problem that the photoresist easily spills out in the closed pattern area is solved, to reduce defects and improve the yield.

In an embodiment of the disclosure, the target area 110 includes a first edge 111 extending along a first direction and a second edge 112 extending along a second direction, the first measurement part 121 extends along the first edge 111, the second measurement part 122 extends along the second edge 112, the first measurement part 121 has a first height A in the first direction, the second measurement part 122 has a second height B in the second direction, and the first height A is greater than or equal to the second height B.

In an embodiment of the disclosure, the line width C of the first measurement part 121 is greater than the line width D of the second measurement part 122, so that the first pattern area 120 has a plurality of measurement criteria, with different line widths corresponding to different measurement criteria.

In an embodiment of the disclosure, there is a first shortest distance M from the first measurement part 121 to the first edge 111, there is a second shortest distance N from the second measurement part 122 to the second edge 112, the first shortest distance M is smaller than or equal to the line width C of the first measurement part 121, and the second shortest distance N is smaller than or equal to the line width D of the second measurement part 122. Since the target area 110 is limited, the smaller the target area 110, the better. The first pattern area 120 is disposed close to the border of the target area 110, so that an area is reserved for subsequently further setting, for example, a second pattern area 130. The target area 110 is generally arranged in a regular pattern, which may include, for example, but not limited to, a square, a rectangle, or the like.

In an embodiment of the disclosure, in the first direction, the first measurement part 121 has a first end, and in the second direction, the second measurement part 122 has a second end. The first end is connected to the second end. The first measurement part 121 and the second measurement part 122 in the first pattern area 120 have a common end, which may include, for example, but not limited to an L-shaped pattern and the like.

In an embodiment of the disclosure, the first height A is at least four times the line width C of the first measurement part 121. That is, the first height A is four or more times the line width C of the first measurement part 121, so that the height A of the first measurement part 121 is much greater than the line width C.

In an embodiment of the disclosure, the first pattern area 120 and the target area 110 have different light transmittances. For example, it may be provided that one is a light transmissive area and the other is a light opaque area. If the first pattern area 120 is a light transmissive area, the pattern left on the wafer after exposure will be the pattern of the first pattern area 120. Specifically, if the first pattern area 120 is a linear light transmissive area, the pattern formed on the wafer by the first pattern area 120 finally is a linear structure that is convex relative to the target area 110, and vice versa.

Figure 2:
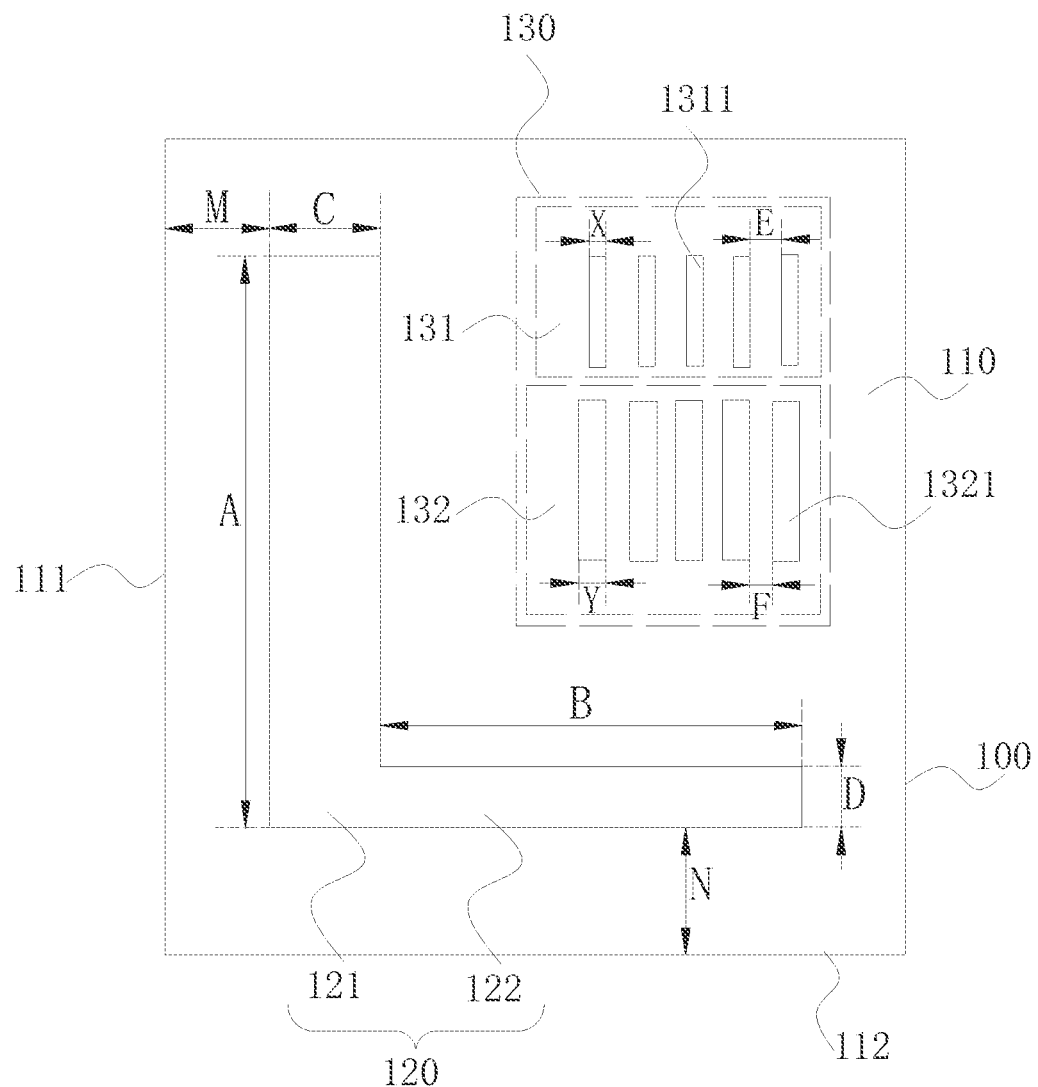
FIG. 2 illustrates another schematic diagram of a CD measurement mark structure of the disclosure.

In an embodiment of the disclosure, as shown in FIG. 2, the target area 110 further includes a second pattern area 130, the second pattern area 130 includes auxiliary pattern areas which are arranged at intervals. The auxiliary pattern areas include a first auxiliary pattern area 131 and a second auxiliary pattern area 132. The first auxiliary pattern area 131 includes a plurality of first auxiliary patterns 1311 which are arranged at intervals, and the second auxiliary pattern area 132 includes a plurality of second auxiliary patterns 1321 which are arranged at intervals. The first auxiliary patterns 1311 and the second auxiliary patterns 1321 have different line widths. The second pattern area 130 serves as a dense area, in which some feature measurement parts are added, and two kinds of auxiliary patterns with different line widths are provided, namely, the first auxiliary pattern 1311 and the second auxiliary pattern 1321, to serve as measurement feature patterns. For each kind of measurement feature pattern, a plurality of such measurement feature patterns are provided, and a plurality of rows of auxiliary patterns with different measurement features are provided, so that the possibility of pattern damage may be effectively reduced or avoided. A dense area part of an existing CD measurement part is generally formed by equidistantly distributed same patterns or only one row of unequidistantly distributed same patterns, and each type of measurement feature in such patterns only has one pattern, so that there is a large risk of damage to the patterns.

In an embodiment of the disclosure, the first auxiliary patterns 1311 and the second auxiliary patterns 1321 are located on the same horizontal plane. This can be finished simultaneously with one process.

In an embodiment of the disclosure, the first auxiliary patterns 1311, the second auxiliary patterns 1321 and the first pattern area 120 are located on the same horizontal plane. This can be finished simultaneously with one process.

In an embodiment of the disclosure, the first auxiliary pattern area 131 and the second auxiliary pattern area 132 are arranged at intervals and in a direction parallel to the second measurement part 122, and the first auxiliary patterns 1311 and the second auxiliary patterns 1321 are arranged at intervals and in a direction parallel to the first measurement part 121.

In an embodiment of the disclosure, the line widths of the first auxiliary patterns 1311 and the second auxiliary patterns 1321 are both smaller than the line width of each of the first measurement part 121 and the second measurement part 122. Namely, the line width X of the first auxiliary patterns 1311 is smaller than the line width C of the first measurement part 121 and smaller than the line width D of the second measurement part 122; and the line width Y of the second auxiliary patterns 1321 is smaller than the line width C of the first measurement part 121 and smaller than the line width D of the second measurement part 122. When the line width C of the first measurement part 121 is greater than the line width D of the second measurement part 122, the line width X of the first auxiliary patterns 1311 is smaller than the line width D of the second measurement part 122; and the line width Y of the second auxiliary patterns 1321 is smaller than the line width D of the second measurement part 122. Patterns in the first pattern area 120 and the second pattern area 130 are set to be different in dimension, then more measurement patterns with different measurement dimensions may be obtained, which is suitable for various measurement scenes.

In an embodiment of the disclosure, a first interval in the same horizontal plane with the target area 110 is formed between the first auxiliary patterns 1311 in the first auxiliary pattern area 131, and the line width E of the first interval and the line width X of the first auxiliary pattern 1311 are both greater than or equal to a first resolution. A second interval in the same horizontal plane with the target area 110 is formed between the second auxiliary patterns 1321 in the second auxiliary pattern area 132, and the line width F of the second interval and the line width Y of the second auxiliary pattern are both greater than or equal to a second resolution. The first resolution and the second resolution are minimum resolutions of different exposure machines. The units of the first resolution and the second resolution should be the same as the unit of line width. Different exposure machines have different minimum resolutions. If the dimension of the measurement mark structure is improper, there is a risk that patterns cannot be resolved, resulting in defects and affecting yield. In the disclosure, two kinds of auxiliary pattern areas with proper measurement dimensions are arranged, to guarantee that the exposure machines may resolve the patterns, so that defects are not prone to being caused, and the yield is improved.

In an embodiment of the disclosure, the first pattern area 120 and the second pattern area 130 have same light transmittance, and the second pattern area 130 and the target area 110 have different light transmittances, so that patterns with the first pattern area 120 and the second pattern area 130 are obtained. The second pattern area 130 may be convex relative to the target area 110, or may be concave relative to the target area 110. From a process perspective, preferably, the second pattern area 130 is concave relative to the target area 110. If the second pattern area 130 is convex relative to the target area 110, the second pattern area 130 may be an isolated area, and the pattern stability is slightly worse than when the second pattern area is concave relative to the target area.

In an embodiment of the disclosure, the horizontal plane where the first pattern area 120 is located is lower than the horizontal plane where the target area 110 is located, namely, the first measurement part 121 and the second measurement part 122 in the first pattern area 120 are concave relative to the target area 110.

In an embodiment of the disclosure, the second pattern area 130 is preferably located within a range formed by the first height A of the first measurement part 121 and the second height B of the second measurement part 122, so that a smaller target area 110 is obtained. Since the measurement patterns may be finally formed on the wafer, the area occupied by the measurement patterns is also the area of the wafer, and if the measurement pattern area is too large, it will inevitably occupy the area of other areas. Thus, the area of each area in the measurement pattern area needs to be reasonably distributed on the premise of reasonably using the area of the wafer, to avoid unnecessary area waste.

The dimensions of the pattern structures in the CD measurement mark structure 100 may be set to be various, specifically, the dimensions may be set according to the minimum resolution of the used exposure machine with reference to the limit requirements of the CD measurement mark structure 100 of the disclosure, so that the application range of the CD measurement mark structure 100 is expanded. In an embodiment of the disclosure, the first measurement part 121 and the second measurement part 122 have a common end, to form an L-shaped pattern. The first height A of the first measurement part 121 may be set to 2.8-8 μm, the line width C may be set to 0.7-2 μm, and the first height A is at least four times the line width C of the first measurement part 121. The second height B of the second measurement part 122 may be set to 6 μm, and the line width D may be set to 0.3-0.7 μm. It needs to be satisfied that: the line width C of the first measurement part 121 is greater than the line width D of the second measurement part 122.

The first shortest distance M may be set to 0.32-1 μm, and it is satisfied that the first shortest distance M is smaller than or equal to the line width C of the first measurement part 121. The second shortest distance N may be set to 0.32-0.7 μm, and it is satisfied that the second shortest distance N is smaller than or equal to the line width D of the second measurement part 122.

The line width X of the first auxiliary pattern 1311 is smaller than the line width D of the second measurement part 122, and the line width E of the first interval and the line width X of the first auxiliary pattern 1311 are both greater than or equal to the minimum resolution. The line width E of the first interval and the line width X of the first auxiliary pattern 1311 may be the same or different.

The line width Y of the second auxiliary pattern 1321 is smaller than the line width D of the second measurement part 122, and the line width F of the second interval and the line width Y of the second auxiliary pattern 1321 are both greater than or equal to the minimum resolution. The line width F of the second interval and the line width Y of the second auxiliary pattern 1321 may be the same or different.

The first auxiliary pattern 1311 and the second auxiliary pattern 1321 have different line widths. For example, the line width X of the first auxiliary pattern 1311 may be smaller than the line width Y of the second auxiliary pattern 1321.

There are many types of exposure machines, and a light source of the exposure machines may include, but is not limited to, an excimer laser including a KrF laser or an ArF laser. The KrF laser typically has a wavelength of 248 nm, and the ArF laser typically has a wavelength of 193 nm. During actual use, the corresponding laser is selected according to corresponding process conditions, and when the corresponding laser is selected, the corresponding photoresist needs to be selected. For example, the photoresist used when the Arf laser is used is an Arf layer, and the photoresist used when the KrF laser is used is a KrF layer. For different types of exposure machines, when the CD measurement mark structure 100 of the present disclosure is used, the dimension of the CD measurement mark structure 100 may be adjusted according to the minimum resolution of the used exposure machine without changing its structure, so that the patterns may be resolved.

Exemplarily, as for the I-line layer (namely, the photoresist layer): the minimum resolution of the exposure machine is 350 nm (0.35 μm); the line width C of the first measurement part 121 may be set to 2 μm; and the line width D of the second measurement part 122 may be set to 0.7 μm.

The line width X of the first auxiliary pattern 1311 may be set to be greater than or equal to 0.35 μm and smaller than or equal to 0.5 μm, the line width E of the first interval between the first auxiliary patterns 1311 may be set to be greater than or equal to 0.35 μm and smaller than or equal to 0.5 μm, and the line width E of the first interval and the line width X of the first auxiliary pattern 1311 are both greater than or equal to 0.35 μm. The line width E of the first interval and the line width X of the first auxiliary pattern 1311 may be the same or different.

The line width Y of the second auxiliary pattern 1321 may be set to be greater than or equal to 0.5 μm and smaller than or equal to 0.7 μm, the line width F of the second interval between the second auxiliary patterns 1321 may be set to be greater than or equal to 0.5 μm and smaller than or equal to 0.7 μm, and the line width F of the second interval and the line width Y of the second auxiliary pattern 1321 are both greater than or equal to 0.35 μm. The line width F of the second interval and the line width Y of the second auxiliary pattern 1321 may be the same or different.

Exemplarily, as for the Krf layer: the minimum resolution of the exposure machine is 110 nm (0.11 μm); the line width C of the first measurement part 121 may be set to 2 μm; and the line width D of the second measurement part 122 may be set to 0.7 μm.

The line width X of the first auxiliary pattern 1311 may be set to be greater than or equal to 0.11 μm and smaller than or equal to 0.3 μm, the line width E of the first interval E between the first auxiliary patterns 1311 may be set to be greater than or equal to 0.11 μm and smaller than or equal to 0.3 μm, and the line width E of the first interval and the line width X of the first auxiliary pattern 1311 are both greater than or equal to 0.11 μm. The line width E of the first interval and the line width X of the first auxiliary pattern 1311 may be the same or different.

The line width Y of the second auxiliary pattern 1321 may be set to be greater than or equal to 0.3 μm and smaller than or equal to 0.7 μm, the line width F of the second interval between the second auxiliary patterns 1321 may be set to be greater than or equal to 0.3 μm and smaller than or equal to 0.7 μm, and the line width F of the second interval and the line width Y of the second auxiliary pattern 1321 are both greater than or equal to 0.11 μm. The line width F of the second interval and the line width Y of the second auxiliary pattern 1321 may be the same or different.

Exemplarily, as for the Arf layer: the minimum resolution of the exposure machine is 65 nm (0.065 μm); the line width C of the first measurement part 121 may be set to 0.7 μm; and the line width D of the second measurement part 122 may be set to 0.3 μm.

The line width X of the first auxiliary pattern 1311 may be set to be greater than or equal to 0.065 μm and smaller than or equal to 0.2 μm, the line width E of the first interval between the first auxiliary patterns 1311 may be set to be greater than or equal to 0.065 μm and smaller than or equal to 0.2 μm, and the line width E of the first interval and the line width X of the first auxiliary pattern 1311 are both greater than or equal to 0.065 μm. The line width E of the first interval and the line width X of the first auxiliary pattern 1311 may be the same or different.

The line width Y of the second auxiliary pattern 1321 may be set to be greater than or equal to 0.2 μm and smaller than or equal to 0.3 μm, the line width F of the second interval between the second auxiliary patterns 1321 may be set to be greater than or equal to 0.2 μm and smaller than or equal to 0.3 μm, and the line width F of the second interval and the line width Y of the second auxiliary pattern 1311 are both greater than or equal to 0.065 μm. The line width F of the second interval and the line width Y of the second auxiliary pattern 1321 may be the same or different.

Compared with the relevant art, the CD measurement mark structure in the disclosure can address the problem that the photoresist easily spills out in a closed pattern area, which will cause defects and affect the yield. In cooperation with the auxiliary pattern areas, the possibility of pattern damage can be effectively reduced or avoided.

The above embodiments are merely illustrative of the principles and utilities of the disclosure and are not intended to limit the disclosure. Any person skilled in the art can modify or change the above-described embodiments without departing from the spirit and scope of the disclosure. Accordingly, it is intended that all equivalent modifications or changes which are made by persons with ordinary knowledge in the technical field without departing from the spirit and technical spirit of the disclosure should be covered by the claims of the disclosure.

What is claimed is:

1. A critical dimension measurement mark structure, comprising a target area and a first pattern area located in the target area, wherein the first pattern area and the target area are located on different horizontal planes, the first pattern area comprises a first measurement part and a second measurement part which have different line widths, and the first measurement part and the second measurement part form an asymmetric open continuous pattern.

2. The mark structure of claim 1, wherein the target area comprises a first edge extending along a first direction and a second edge extending along a second direction, the first measurement part extends along the first edge, the second measurement part extends along the second edge, the first measurement part has a first height in the first direction, the second measurement part has a second height in the second direction, and the first height is greater than or equal to the second height.

3. The mark structure of claim 2, wherein the line width of the first measurement part is greater than the line width of the second measurement part.

4. The mark structure of claim 2, wherein there is a first shortest distance from the first measurement part to the first edge, and there is a second shortest distance from the second measurement part to the second edge, the first shortest distance being smaller than or equal to the line width of the first measurement part, and the second shortest distance being smaller than or equal to the line width of the second measurement part.

5. The mark structure of claim 2, wherein in the first direction, the first measurement part has a first end, and in the second direction, the second measurement part has a second end, the first end being connected to the second end.

6. The mark structure of claim 2, wherein the first height is at least four times the line width of the first measurement part.

7. The mark structure of claim 1, wherein the first pattern area and the target area have different light transmittances.

8. The mark structure of claim 1, wherein the target area further comprises a second pattern area, the second pattern area comprises auxiliary pattern areas which are arranged at intervals, the auxiliary pattern areas comprise a first auxiliary pattern area and a second auxiliary pattern area, and wherein the first auxiliary pattern area comprises a plurality of first auxiliary patterns which are arranged at intervals, and the second auxiliary pattern area comprises a plurality of second auxiliary patterns which are arranged at intervals, the first auxiliary pattern and the second auxiliary pattern having different line widths.

9. The mark structure of claim 8, wherein the first auxiliary patterns and the second auxiliary patterns are located on the same horizontal plane.

10. The mark structure of claim 8, wherein the first auxiliary patterns, the second auxiliary patterns and the first pattern area are located on the same horizontal plane.

11. The mark structure of claim 10, wherein a first interval in the same horizontal plane with the target area is formed between the first auxiliary patterns in the first auxiliary pattern area, a line width of the first interval and the line width of the first auxiliary pattern are both greater than or equal to a first resolution, wherein a second interval in the same horizontal plane with the target area is formed between the second auxiliary patterns in the second auxiliary pattern area, a line width of the second interval and the line width of the second auxiliary pattern are both greater than or equal to a second resolution, and wherein the first resolution and the second resolution are minimum resolutions of different exposure machines.

12. The mark structure of claim 8, wherein the first auxiliary pattern area and the second auxiliary pattern area are arranged at intervals and in a direction parallel to the second measurement part, and the first auxiliary patterns and the second auxiliary patterns are arranged at intervals and in a direction parallel to the first measurement part.

13. The mark structure of claim 8, wherein the line width of the first auxiliary pattern and the line width of the second auxiliary pattern are both smaller than the line width of each of the first measurement part and the second measurement part.

14. The mark structure of claim 8, wherein the first pattern area and the second pattern area have a same light transmittance, and the second pattern area and the target area have different light transmittances.

15. The mark structure of claim 1, wherein the horizontal plane where the first pattern area is located is lower than the horizontal plane where the target area is located.

* * * * *